United States Patent [19]

Chiou

[11] Patent Number: 5,437,327

[45] Date of Patent: Aug. 1, 1995

[54] CPU HEAT DISSIPATING FAN DEVICE

[76] Inventor: Ming Der Chiou, 3F., No. 3, Alley 11, Lane 327, Sec. 2, Chung Shan Rd., Chung Ho City, Taipei, Taiwan

[21] Appl. No.: 228,847

[22] Filed: Apr. 18, 1994

[51] Int. Cl.⁶ .............................................. F28F 7/00
[52] U.S. Cl. .................................. 165/122; 165/80.3; 415/213.1
[58] Field of Search .......................... 165/122, 80.3; 415/213.1, 214.1

[56] References Cited

U.S. PATENT DOCUMENTS 5,208,230  5/1993  Tracy ............................... 415/213.1
5,288,203  2/1994  Thomas .......................... 415/213.1

Primary Examiner—A. Michael Chambers
Attorney, Agent, or Firm—Pro-Techtor International

[57] ABSTRACT

A CPU heat dissipating fan device, which includes a radiating flange having radiating fins and mounting holes within the radiating fins, a motor mount having split bolts at the bottom respectively fitted into the mounting holes on the radiating flange, and a fan motor mounted on the motor mount and surrounded by the radiating fins.

4 Claims, 5 Drawing Sheets

CPU HEAT DISSIPATING FAN DEVICE

BACKGROUND OF THE INVENTION

The present invention relates to a CPU heat dissipating fan device, and more particularly to such a CPU heat dissipating device which is inexpensive to manufacture and easy to assemble.

During the operation of the CPU of a computer system or the like, the CPU will release heat, and heat must be quickly carried away so that the service life of the CPU can be prolonged. FIG. 1 shows a CPU heat dissipating fan device used for this purpose. The CPU heat dissipating fan device is generally comprised of a radiating flange 2 fastened to the CPU at the top through hooked joints 1, a motor mount 4 fastened to the radiating flange 2 by screws 5 to hold a fan motor 3. This structure of CPU heat dissipating fan device is functional, however, it is complicated to assemble, and therefore it is not suitable for a mass production.

SUMMARY OF THE INVENTION

The present invention has been accomplished under the aforesaid circumstances. It is one object of the present invention to provide a CPU heat dissipating fan device which is easy to assemble. It is another object of the present invention to provide a CPU heat dissipating fan device which is suitable for mass production and therefore its manufacturing cost is low. To achieve these objects, there is provided a CPU heat dissipating fan device comprised of a radiating flange having radiating fins and mounting holes within the radiating fins, a motor mount having split bolts at the bottom respectively fitted into the mounting holes on the radiating flange, and a fan motor mounted on the motor mount and surrounded by the radiating fins. The split bolts have each a longitudinal center hole and at least one longitudinal split respectively communicated with the longitudinal center hole for permitting the split bolts to be respectively radially compressed to reduce the outer diameter for fitting into either mounting hole on the radiating flange.

DETAILED DESCRIPTION OF THE PREFERRED EMBODIMENTS

Figure 1:
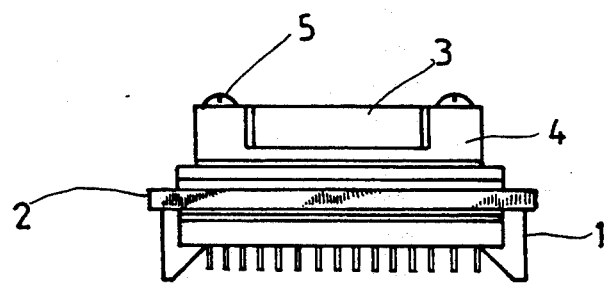
FIG. 1 is a front view showing a CPU heat dissipating fan device installed according the prior art.
Figures 2, 2A:
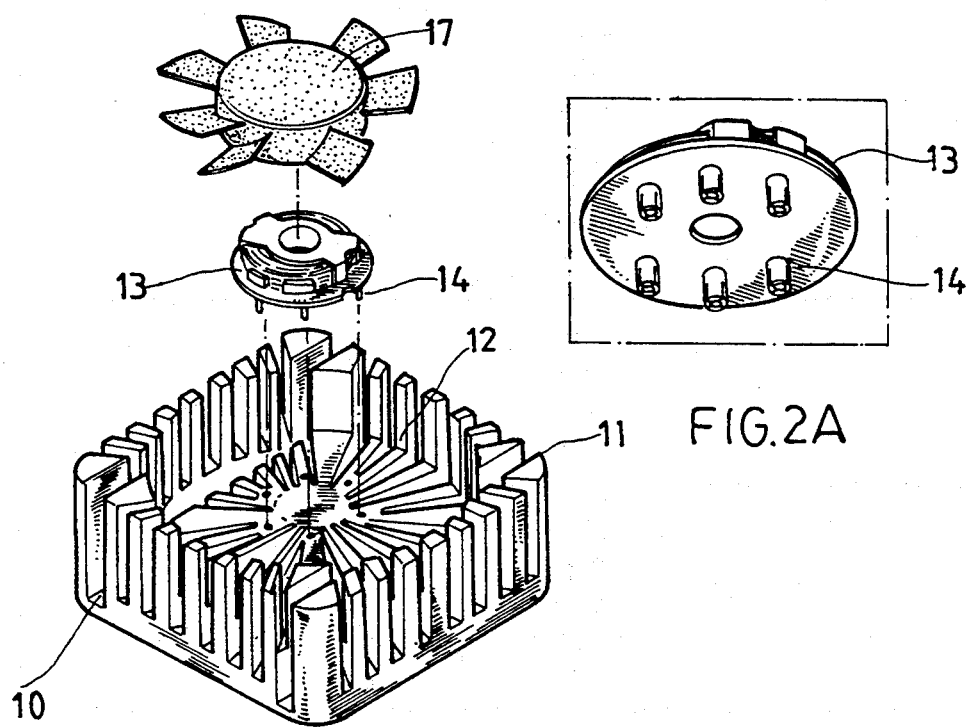
FIG. 2 is an exploded view of a CPU heat dissipating fan device according to the preferred embodiment of the present invention.
Figure 3:
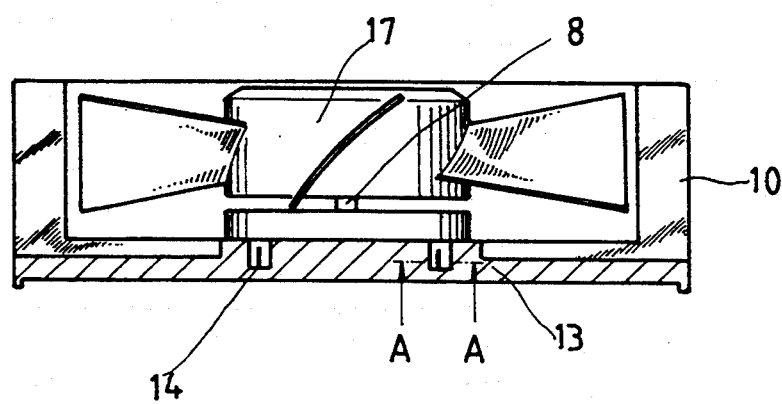
FIG. 3 a sectional view of the CPU heat dissipating fan device shown in FIG. 2.
Figure 3A:
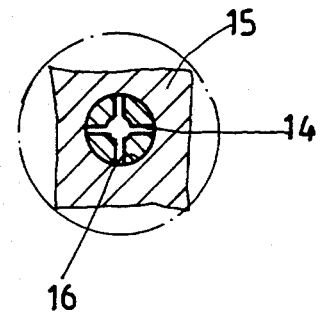
Figure 4:
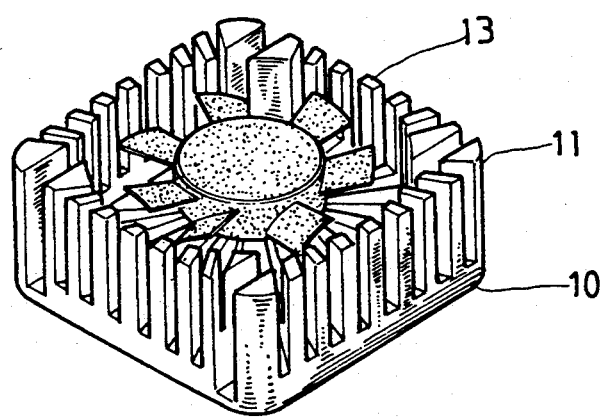
FIG. 4 is an elevational view of the CPU heat dissipating fan device shown in FIG. 2.

Referring to FIGS. 2, 3, and 4, the radiating flange, referenced by 10, comprises a plurality of radiating fins 11 raised from the flat bottom thereof around the border and a plurality of mounting holes 12 at the center spaced around a circle. A motor mount 13 is provided having a plurality of split bolts 14 at the bottom respectively fitted into the mounting holes 12 on the radiating flange 10. There is also provided a fan motor 17 having its motor shaft 18 inserted into an axle hole at the center of the motor mount 13. The split bolts 14, as shown in FIG. 3, have each a longitudinal center hole 14 and at least one longitudinal splits 16 respectively communicated with the longitudinal center hole 14. The outer diameter of the split bolts 14 is slightly bigger than the diameter of the mounting holes 12. The longitudinal splits 16 on the split bolts 14 allow the split bolts 14 to be compressed and fitted into the mounting holes 12. Therefore, the motor mount 13 is fixed to the radiating flange 10 when the split bolts 14 are respectively fitted into the mounting holes 12. The finding force of the split bolts 14 depends on the material. The split bolts 14 may be molded from a resilient plastic material.

Figure 5:
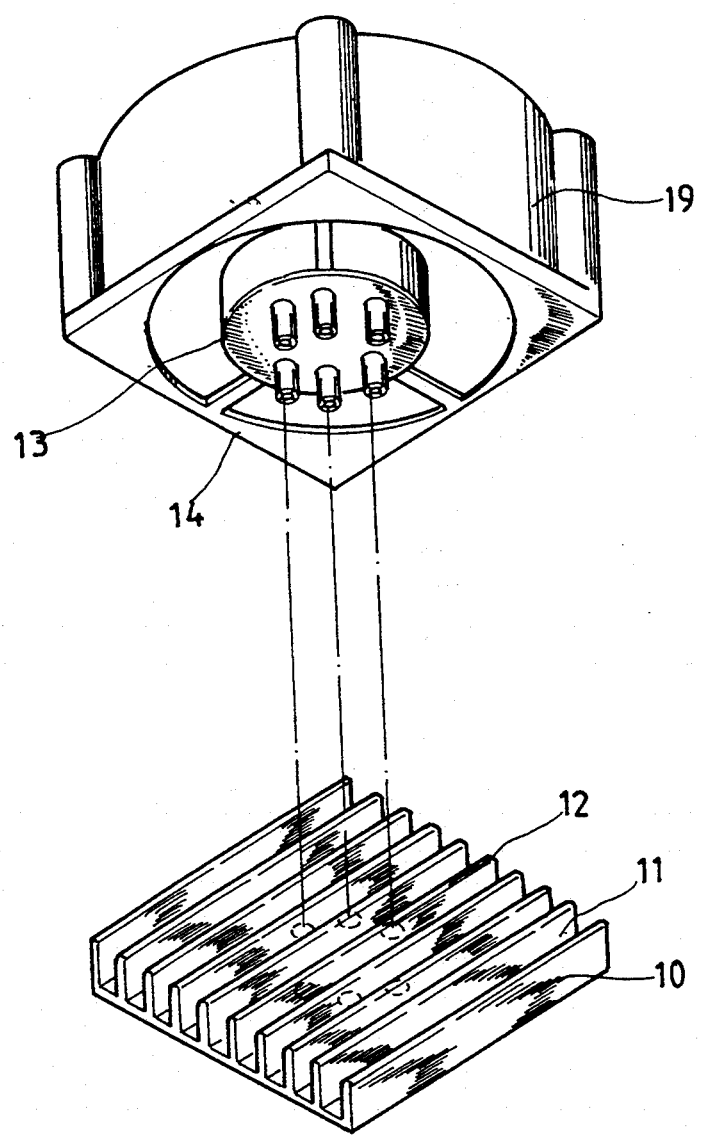
FIG. 5 is an exploded view of an alternate form of the present invention.

Referring to FIG. 5, therein illustrated is an alternate form of the present invention. According to this alternate form, a cover shell 19 is fastened to the motor mount 13 to hold the fan motor 17 on the inside; the radiating flange 10 is made in a flat configuration having a plurality of radiating fins 11 and mounting holes 12 for receiving the split bolts 14 of the motor mount 13.

While only few embodiments of the present invention has been shown and described, it will be understood that various modifications and changes could be made without departing from the spirit and scope of the invention.

What is claimed is:

1. A CPU heat dissipating device comprising:
   a radiating flange, a motor mount, and a fan motor; wherein
   said radiating flange includes a plurality of mounting holes in a central area thereof, said mounting holes have an open upper end and a closed lower end,
   said motor mount includes an axle hole in a center thereof, said axle hole receives a motor shaft of said fan motor, and
   said motor mount further includes a plurality of split bolts extending downward from a bottom side of said motor mount, said split bolts being received in said mounting holes of said radiating flange.

2. The CPU heat dissipating device of claim 1 wherein:
   said split bolts each have a terminal end whose outer diameter is slightly larger that the inner diameter of said mounting holes.

3. The CPU heat dissipating device of claim 1 wherein:
   said split bolts each have a longitudinal center hole and at least one longitudinal split passing through said center hole, said center hole and said split permitting said split bolts to be compressed as they are inserted into said mounting holes, thereby securing the motor mount by a friction fit.

4. The CPU heat dissipating device of claim 1 wherein:
   said split bolts each have at least one longitudinal split, said split permitting said split bolts to be compressed as they are inserted into said mounting holes, thereby securing the motor mount by a friction fit.

* * * * *